(12) United States Patent
Tang

(10) Patent No.: US 12,108,636 B2
(45) Date of Patent: Oct. 1, 2024

(54) OLED DISPLAY PANEL AND MANUFACTURING METHOD THEREOF

(71) Applicant: Shenzhen China Star Optoelectronics Semiconductor Display Technology Co., Ltd., Guangdong (CN)

(72) Inventor: Jia Tang, Guangdong (CN)

(73) Assignee: Shenzhen China Star Optoelectronics Semiconductor Display Technology Co., Ltd., Shenzhen (CN)

( * ) Notice: Subject to any disclaimer, the term of this patent is extended or adjusted under 35 U.S.C. 154(b) by 816 days.

(21) Appl. No.: 17/056,455

(22) PCT Filed: Oct. 30, 2020

(86) PCT No.: PCT/CN2020/125163
§ 371 (c)(1),
(2) Date: Nov. 18, 2020

(87) PCT Pub. No.: WO2022/047973
PCT Pub. Date: Mar. 10, 2022

(65) Prior Publication Data
US 2022/0310740 A1    Sep. 29, 2022

(30) Foreign Application Priority Data
Sep. 2, 2020  (CN) .......................... 202010907704.2

(51) Int. Cl.
| | | |
|---|---|---|
| H10K 59/131 | (2023.01) |
| H01L 23/00 | (2006.01) |
| H10K 59/126 | (2023.01) |
| H10K 71/00 | (2023.01) |
| H10K 59/12 | (2023.01) |
| H10K 59/122 | (2023.01) |

(52) U.S. Cl.
CPC .......... *H10K 59/131* (2023.02); *H01L 24/05* (2013.01); *H10K 59/126* (2023.02); *H10K 71/00* (2023.02);
(Continued)

(58) Field of Classification Search
CPC .. H10K 29/122; H10K 29/126; H10K 29/131; H10K 71/00; H10K 59/12;
(Continued)

(56) References Cited

U.S. PATENT DOCUMENTS 5,920,083 A * 7/1999 Bae .................. H01L 29/42384
257/E27.111
8,519,407 B2 * 8/2013 Park .................. H10K 59/126
257/E31.022
(Continued)

FOREIGN PATENT DOCUMENTS

CN    107039491    8/2017
CN    109300917    2/2019
(Continued)

*Primary Examiner* — Eduardo A Rodela

(57) ABSTRACT

The present invention provides an OLED display panel and a manufacturing method thereof. The OLED display panel comprises a display area and a bonding area defined at least at one side of the display area. The OLED display panel further comprises a substrate and a first metal layer disposed on the substrate. The first metal layer comprises a light-shielding metal disposed corresponding to the display area and a bonding metal disposed corresponding to the bonding area.

19 Claims, 3 Drawing Sheets

(52) U.S. Cl.
CPC .... *H01L 24/03* (2013.01); *H01L 2224/03614* (2013.01); *H01L 2224/05567* (2013.01); *H01L 2224/05573* (2013.01); *H01L 2224/05624* (2013.01); *H01L 2224/05666* (2013.01); *H01L 2224/0568* (2013.01); *H01L 2924/0132* (2013.01); *H10K 59/1201* (2023.02); *H10K 59/122* (2023.02)

(58) Field of Classification Search
CPC .. H10K 59/123; H10K 59/124; H10K 59/125; H10K 59/126; H10K 59/131; H10K 59/822; H10K 59/82
See application file for complete search history.

(56) References Cited

U.S. PATENT DOCUMENTS

| | | | | |
|---|---|---|---|---|
| 9,343,520 B2* | 5/2016 | Lee | ............... | H10K 59/121 |
| 9,954,043 B2* | 4/2018 | Park | ............... | H10K 59/126 |
| 10,884,304 B2* | 1/2021 | Jian | ............... | G02F 1/136286 |
| 10,886,489 B2* | 1/2021 | Lee | ............... | H10K 59/131 |
| 11,069,721 B2* | 7/2021 | Jung | ............... | H01L 23/528 |
| 11,322,698 B2* | 5/2022 | Lee | ............... | H10K 50/865 |
| 11,342,539 B2* | 5/2022 | Han | ............... | H10K 59/12 |
| 11,515,480 B2* | 11/2022 | Park | ............... | H10K 85/633 |
| 2014/0209895 A1* | 7/2014 | Wang | ............... | H01L 29/7869 257/43 |
| 2017/0179159 A1 | 6/2017 | Kawata | | |
| 2017/0192580 A1* | 7/2017 | Jung | ............... | G02F 1/134309 |

FOREIGN PATENT DOCUMENTS

| | | |
|---|---|---|
| CN | 109728188 | 5/2019 |
| CN | 110071147 | 7/2019 |
| CN | 111223817 | 6/2020 |
| CN | 111445846 | 7/2020 |
| CN | 112234080 | 1/2021 |
| KR | 10-2015-0084239 | 7/2015 |

* cited by examiner

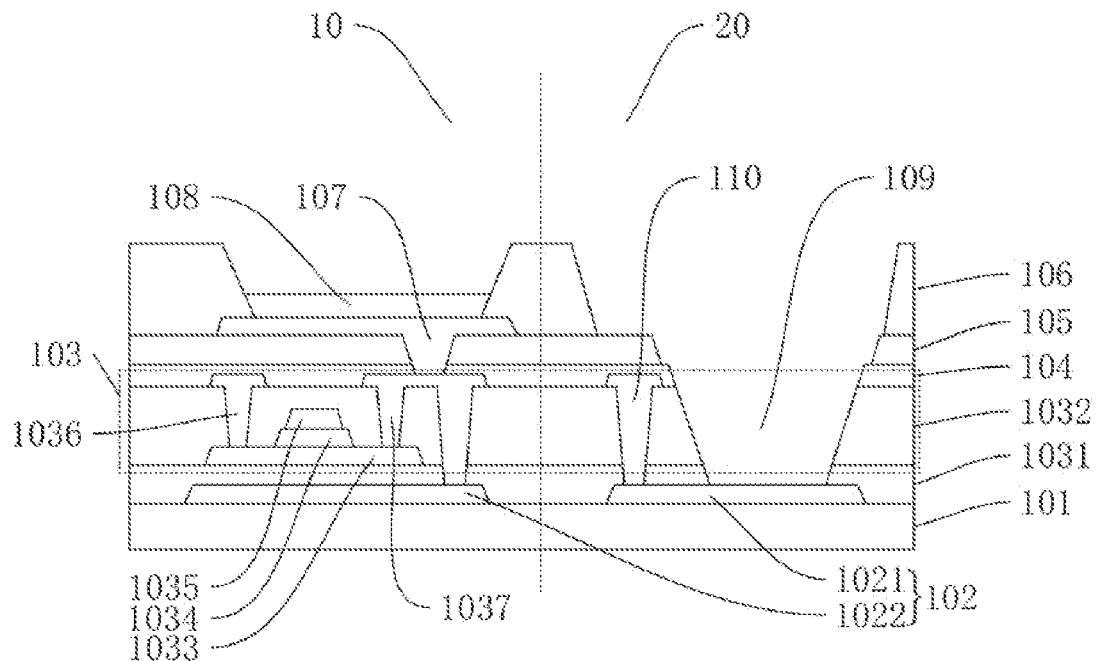

FIG. 1

PREPARING A FIRST METAL LAYER ON A SUBSTRATE, AND THE FIRST METAL LAYER COMPRISES A LIGHT-SHIELDING METAL DISPOSED CORRESPONDING TO THE DISPLAY AREA AND A BONDING METAL DISPOSED CORRESPONDING TO THE BONDING AREA — S10

PREPARING A THIN FILM TRANSISTOR DEVICE LAYER ON THE FIRST METAL LAYER, AND THE THIN FILM TRANSISTOR DEVICE LAYER COMPRISES A THIN FILM TRANSISTOR AND A SPACER LAYER CORRESPONDINGLY LOCATED ABOVE THE LIGHT-SHIELDING METAL, THE SPACER LAYER IS FORMED WITH AN OPENING IN THE BONDING AREA TO EXPOSE A PORTION OF AN UPPER SURFACE OF THE BONDING METAL — S20

FIG. 2

OLED DISPLAY PANEL AND MANUFACTURING METHOD THEREOF

RELATED APPLICATIONS

This application is a National Phase of PCT Patent Application No. PCT/CN2020/125163 having International filing date of Oct. 30, 2020, which claims the benefit of priority of Chinese Patent Application No. 202010907704.2 filed on Sep. 2, 2020. The contents of the above applications are all incorporated by reference as if fully set forth herein in their entirety.

FIELD AND BACKGROUND OF THE INVENTION

The present invention relates to the field of display technology, in particular to an OLED display panel and a manufacturing method thereof.

Organic light emitting diode (OLED) displays have attracted much attention as a display apparatus for displaying images. OLED displays have self-luminous characteristics and do not use a separate light source, thus they are thinner and lighter than display apparatuses that use a separate light source.

However, in the prior art, OLED displays use Cu traces as transistor devices, such as a gate electrode, a source electrode, and a drain electrode, etc., to reduce trace impedance. Due to its poor stability, Cu is easy to oxidize when exposed to an external environment, so it cannot be directly used as a bonding metal. At present, an ITO anode layer is often used to cover Cu to improve stability of bonding metal. However, for top-emitting OLED displays, when a reflective metal layer (Ag or Al) is etched, Cu in the bonding metal is easily corroded by an etching solution, so that the stability of the bonding metal obtained by covering the Cu with the ITO layer is also poor, and it is susceptible to corrosion by the etching solution, thereby affecting a product yield.

The embodiments of the present invention provide an OLED display panel and a manufacturing method thereof, which can solve the technical problem below: in the prior art, the bonding metal is easily corroded by an etching solution during the manufacturing process and is unstable in the environment, thereby affecting the product yield.

SUMMARY OF THE INVENTION

To solve the above technical problem, the embodiments of the present invention provide an OLED display panel, comprising a display area and a bonding area defined at least at one side of the display area;
the OLED display panel further comprises:
a substrate;
a first metal layer disposed on the substrate, wherein the first metal layer comprises a light-shielding metal disposed corresponding to the display area and a bonding metal disposed corresponding to the bonding area; and
a thin film transistor device layer disposed on the first metal layer, wherein the thin film transistor device layer comprises a thin film transistor and a spacer layer correspondingly located above the light-shielding metal, and the spacer layer is formed with an opening in the bonding area to expose a portion of an upper surface of the bonding metal;
wherein a material of the first metal layer comprises a molybdenum titanium alloy or an aluminum titanium alloy.

In an embodiment of the present invention, the thin film transistor device layer comprises a second metal layer located above the first metal layer, and the second metal layer comprises a source electrode and a drain electrode disposed corresponding to the display area and a signal trace disposed corresponding to the bonding area.

In an embodiment of the present invention, the source electrode is connected to the light-shielding metal through a via hole penetrating a portion of the spacer layer, the signal trace is connected to the bonding metal through another via hole penetrating another portion of the spacer layer, and the bonding metal is electrically connected to the thin film transistor through the signal trace.

In an embodiment of the present invention, the OLED display panel further comprises an interlayer insulating layer, a planarization layer, an anode, and a pixel defining layer sequentially disposed on the thin film transistor device layer, and the interlayer insulating layer, the planarization layer, the anode, and the pixel defining layer are all disposed staggered from the opening to expose the portion of the upper surface of the bonding metal.

In an embodiment of the present invention, the anode is connected to the source electrode through a via hole penetrating the planarization layer and a portion of the interlayer insulating layer.

In an embodiment of the present invention, the pixel defining layer has a pixel opening that exposes an upper surface of the anode, and the OLED display panel further comprises a light-emitting layer disposed inside the pixel opening and covering the upper surface of the anode.

According to the above objectives of the present invention, an OLED display panel is provided. The OLED display panel comprises a display area and a bonding area defined at least at one side of the display area;
the OLED display panel further comprises:
a substrate;
a first metal layer disposed on the substrate, wherein the first metal layer comprises a light-shielding metal disposed corresponding to the display area and a bonding metal disposed corresponding to the bonding area; and
a thin film transistor device layer disposed on the first metal layer, wherein the thin film transistor device layer comprises a thin film transistor and a spacer layer correspondingly located above the light-shielding metal, and the spacer layer is formed with an opening in the bonding area to expose a portion of an upper surface of the bonding metal.

In an embodiment of the present invention, the thin film transistor device layer comprises a second metal layer located above the first metal layer, and the second metal layer comprises a source electrode and a drain electrode disposed corresponding to the display area and a signal trace disposed corresponding to the bonding area.

In an embodiment of the present invention, the source electrode is connected to the light-shielding metal through a via hole penetrating a portion of the spacer layer, the signal trace is connected to the bonding metal through another via hole penetrating another portion of the spacer layer, and the bonding metal is electrically connected to the thin film transistor through the signal trace.

In an embodiment of the present invention, the OLED display panel further comprises an interlayer insulating layer, a planarization layer, an anode, and a pixel defining layer sequentially disposed on the thin film transistor device layer, and the interlayer insulating layer, the planarization layer, the anode, and the pixel defining layer are all disposed staggered from the opening to expose the portion of the upper surface of the bonding metal.

In an embodiment of the present invention, the anode is connected to the source electrode through a via hole penetrating the planarization layer and a portion of the interlayer insulating layer.

In an embodiment of the present invention, the pixel defining layer has a pixel opening that exposes an upper surface of the anode, and the OLED display panel further comprises a light-emitting layer disposed inside the pixel opening and covering the upper surface of the anode.

According to the above objectives of the present invention, a manufacturing method of an OLED display panel is provided. The OLED display panel comprises a display area and a bonding area defined at least at one side of the display area, and the method comprises:

step S10, preparing a first metal layer on a substrate, and the first metal layer comprises a light-shielding metal disposed corresponding to the display area and a bonding metal disposed corresponding to the bonding area; and step S20, preparing a thin film transistor device layer on the first metal layer, and the thin film transistor device layer comprises a thin film transistor and a spacer layer correspondingly located above the light-shielding metal, the spacer layer is formed with an opening in the bonding area to expose a portion of an upper surface of the bonding metal.

In an embodiment of the present invention, the step S20 comprises:

step S201, sequentially preparing a buffer layer, an active layer, a gate insulating layer, a gate electrode, and an interlayer dielectric layer on the first metal layer;

step S202, preparing a second metal layer on the interlayer dielectric layer, and the second metal layer comprises a source electrode and a drain electrode disposed corresponding to the display area, and a signal trace disposed corresponding to the bonding area; and step S203, at least the buffer layer and the interlayer dielectric layer above the bonding metal are removed to form an opening, and a portion of the upper surface of the bonding metal is exposed.

In an embodiment of the present invention, in the step S201, a first via hole and a second via hole penetrating a portion of the interlayer dielectric layer are prepared corresponding to the display area, so as to expose upper surfaces on both sides of the active layer respectively, and a third via hole and a fourth via hole penetrating the interlayer dielectric layer and a portion of the buffer layer are prepared corresponding to the display area and the bonding area respectively, so as to expose a portion of an upper surface of the light-shielding metal and a portion of the upper surface of the bonding metal respectively.

In an embodiment of the present invention, in the step S202, the source electrode fills one of the first via hole or the second via hole and connects to one side of the active layer, the drain electrode fills the other of the first via hole or the second via hole and connects to the other side of the active layer, the source electrode also fills the third via hole and connects to the light-shielding metal, and the signal trace fills the fourth via hole and connects to the bonding metal.

In an embodiment of the present invention, in the step S203, a photoresist material layer is prepared to cover a portion of an upper surface of the interlayer dielectric layer, and the interlayer dielectric layer not covered by the photoresist material layer and the corresponding buffer layer are removed to form the opening.

In an embodiment of the present invention, the step S203 further comprises sequentially preparing an interlayer insulating layer, a planarization layer, an anode, and a pixel defining layer on the thin film transistor device layer, and the interlayer insulating layer, the planarization layer, the anode, and the pixel defining layer are all disposed staggered from the opening to expose a portion of the upper surface of the bonding metal.

In an embodiment of the present invention, the anode is connected to the source electrode through a via hole penetrating the planarization layer and a portion of the interlayer insulating layer.

In an embodiment of the present invention, a material of the first metal layer comprises a molybdenum titanium alloy or an aluminum titanium alloy.

Compared with the prior art, the present invention uses the metal material of the same layer as the light-shielding metal to make the bonding metal while preparing the light-shielding metal. Since the light-shielding metal has a better stability and corrosion resistance, the stability and corrosion resistance of the bonding metal is improved, and the reliability and yield of OLED display panels is improved.

BRIEF DESCRIPTION OF THE SEVERAL
VIEWS OF THE DRAWINGS

The technical solutions, as well as other beneficial advantages, of the present invention will be apparent from the following detailed descriptions of embodiments of the present invention with reference to the accompanying drawings.

FIG. 1 is a schematic structural diagram of an OLED display panel according to an embodiment of the present invention.

FIG. 2 is a flowchart of a manufacturing method of an OLED display panel according to an embodiment of the present invention.

Figure 3:
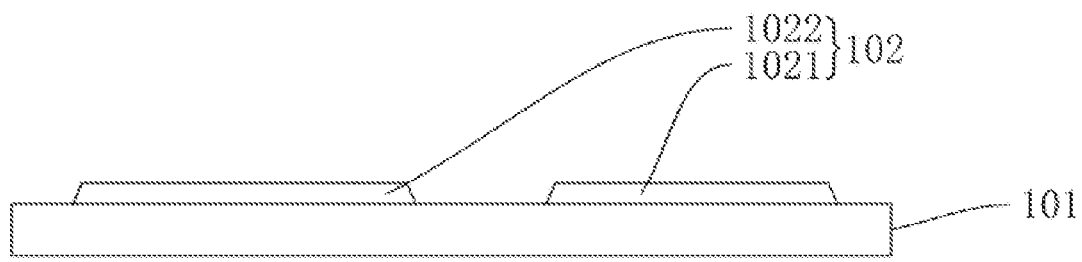
FIG. 3 is a schematic structural diagram of a manufacturing process of an OLED display panel according to an embodiment of the present invention.

DESCRIPTION OF SPECIFIC EMBODIMENTS
OF THE INVENTION

The technical solutions in the embodiments of the present invention will be described clearly and completely hereinafter with reference to the accompanying drawings. It is apparent that the described embodiments are only a part of embodiments of the present invention, not all the embodiments. All other embodiments obtained by those skilled in the art based on the embodiments of the present invention without creative efforts shall fall within the protection scope of the present invention.

In description of the present invention, it should be understood that orientational or positional relationships represented by directional terms, such as "central", "longitudinal", "lateral", "length", "width", "thickness", "up", "down", "front", "rear", "left", "right", "vertical", "horizontal", "top", "bottom", "inside", "outside", "clockwise", "anticlockwise" etc., are orientational or positional relationships based on the drawings, and are merely for the convenience of describing the present invention and simplifying the description, rather than indicating or implying that the device or element is intended to have a particular orientation, or is constructed and operated in a particular orientation, and therefore, should not be interpreted as a limitation of the present invention. In addition, terms such as "first" and "second" are used herein for purposes of description, and should not be interpreted as indication or implication of relative importance, or implied indication of a number of the technical features. Therefore, features limited by terms such as "first" and "second" can explicitly or impliedly include one or more than one of these features. In description of the present invention, "a plurality of" means two or more than two, unless otherwise specifically defined.

In the present invention, it is stated that, unless specified or limited otherwise, the terms "mounted," "connected," "coupled," "fixed" and the like are interpreted broadly, and may be, for example, fixed connections, detachable connections, or integral connections; may also be mechanical or electrical connections; may also be direct connections or indirect connections via intervening structures; may also be inner communications of two elements. For those skilled in the art, the specific meanings of the above terms in the present invention can be understood according to specific circumstances.

In the present invention, unless specified or limited otherwise, a first feature is "on" or "below" a second feature may include an embodiment in which the first feature is in direct contact with the second feature, and may also include an embodiment in which the first feature and the second feature are not in direct contact with each other, but are contacted via an additional feature formed therebetween. Furthermore, a first feature "on," "above," or "on top of" a second feature may include an embodiment in which the first feature is right or obliquely "on," "above," or "on top of" the second feature, or just means that the first feature is at a height higher than that of the second feature. A first feature "below," "under," or "on bottom of" a second feature may include an embodiment in which the first feature is right or obliquely "below," "under," or "on bottom of" the second feature, or just means that the first feature is at a height lower than that of the second feature.

Various embodiments and examples are provided in the following description to implement different structures of the present invention. In order to simplify the present invention, certain elements and settings will be described hereinafter. However, these elements and settings are only by way of example and are not intended to limit the present invention. In addition, reference numerals may be repeated in different examples in the present invention. This repeating is for the purpose of simplification and clarity and does not refer to relations between different embodiments and/or settings. Furthermore, examples of different processes and materials are provided in the present invention. However, it would be appreciated by those skilled in the art that other processes and/or materials may be also applied.

The embodiments of the present invention provide an OLED display panel and a manufacturing method thereof, which can solve the technical problem below: in the prior art, the bonding metal is easily corroded by an etching solution during the manufacturing process and is unstable in the environment, thereby affecting the product yield.

To solve the above problems, the embodiments of the present invention provide an OLED display panel. Referring to FIG. 1, it is a schematic structural diagram of an OLED display panel according to an embodiment of the present invention. The OLED display panel comprises a display area 10 and a bonding area 20 defined at least at one side of the display area 10.

The OLED display panel further comprises: a substrate 101; a first metal layer 102 disposed on the substrate 101, the first metal layer 102 comprises a light-shielding metal 1022 disposed corresponding to the display area 10 and a bonding metal 1021 disposed corresponding to the bonding area 20; and a thin film transistor device layer 103 disposed on the first metal layer 102, the thin film transistor device layer 103 comprises a thin film transistor and a spacer layer correspondingly located above the light-shielding metal 1022, and the spacer layer is formed with an opening 109 in the bonding area 20 to expose a portion of an upper surface of the bonding metal 1021.

In the process of implementation, in the existing OLED display panels, the material of the bonding metal is susceptible to corrosion during the manufacturing process and cannot exist stably in the environment. Therefore, the present invention provides an OLED display panel, which uses the metal material of the same layer as the light-shielding metal to prepare the bonding metal, so as to improve the stability and corrosion resistance of the bonding metal, and further improve the reliability and yield of OLED display panels.

Furthermore, referring to FIG. 1, the OLED display panel comprises: a substrate 101, a first metal layer 102 disposed on the substrate 101, and a thin film transistor device layer 103 disposed on the first metal layer 102. The first metal layer 102 comprises a light-shielding metal 1022 disposed corresponding to the display area 10 and a bonding metal 1021 disposed corresponding to the bonding area 20. A material of the first metal layer 102 comprises a molybdenum titanium alloy or an aluminum titanium alloy, and is not limited to a single-layer or laminated alloy structure of molybdenum and titanium, or a single-layer or laminated alloy structure of aluminum and titanium. In addition, the material of the first metal layer 102 may also comprise other metal materials or alloy materials with strong acid resistance and strong reliability.

The thin film transistor device layer 103 comprises a thin film transistor and a spacer layer correspondingly located above the light-shielding metal 1022. Specifically, the thin film transistor device layer 103 comprises: a buffer layer 1031 disposed on the first metal layer 102; an active layer 1033 disposed on the buffer layer 1031 and above the light-shielding metal 1022; a gate insulating layer 1034 and a gate electrode 1035 which are sequentially disposed on the active layer 1033; an interlayer dielectric layer 1032 disposed on the active layer 1033 and the gate electrode 1035; and a second metal layer disposed on the interlayer dielectric layer 1032. The second metal layer is disposed above the first metal layer 102. The second metal layer comprises a source electrode 1037 and a drain electrode 1036 disposed corresponding to the display area 10, and a signal trace 110 disposed corresponding to the bonding area 20. The source electrode 1037 and the drain electrode 1036 connect to one side of the active layer 1033 through a via hole penetrating a portion of the interlayer dielectric layer 1032, respectively. The source electrode 1037 is also connected to the light-shielding metal 1022 through a via hole penetrating a portion of the spacer layer, which can be used to conduct the charge on the light-shielding metal 1022 to maintain the stability of the electrical characteristics of the thin film transistor. In addition, the signal trace 110 is connected to the bonding metal 1021 through another via hole penetrating another portion of the spacer layer, thus the bonding metal 1021 is electrically connected to the thin film transistor (not shown in the figure). In the subsequent manufacturing process, the bonding metal 1021 is further electrically bonded to the circuit board, so that the transmission of the display signal can be realized, thereby realizing the normal display function of the OLED display panel.

In the embodiment of the present invention, the thin film transistor comprises the active layer 1033, the gate electrode 1035, the source electrode 1037, and the drain electrode 1036. The spacer layer comprises the buffer layer 1031, the interlayer dielectric layer 1032, and the gate insulating layer 1034.

Moreover, the OLED display panel further comprises an interlayer insulating layer 104, a planarization layer 105, an anode 107, and a pixel defining layer 106 sequentially disposed on the thin film transistor device layer 103. The pixel defining layer 106 defines a plurality of pixel openings. Each of the plurality of pixel openings exposes an upper surface of the anode 107. At the same time, a light-emitting layer 108 is formed inside the pixel opening and located on the anode 107. The anode 107 is also connected to the source electrode 1037 through a via hole penetrating the planarization layer 105 and a portion of the interlayer insulating layer 104, so as to realize the transmission of electrical signals, and the material of pixel defining layer 106 is not limited to conventional non-hydrophobic materials or hydrophobic materials.

In the embodiment of the present invention, the interlayer insulating layer 104, the planarization layer 105, the anode 107, and the pixel defining layer 106 are all disposed staggered from the opening 109 to expose the portion of the upper surface of the bonding metal 1021.

In summary, the OLED display panel provided by the embodiments of the present invention uses the material of the same layer as the light-shielding metal to make the bonding metal, so as to improve the acid resistance and reliability of the bonding metal, and further improve the reliability and yield of OLED display panels.

Figure 4:
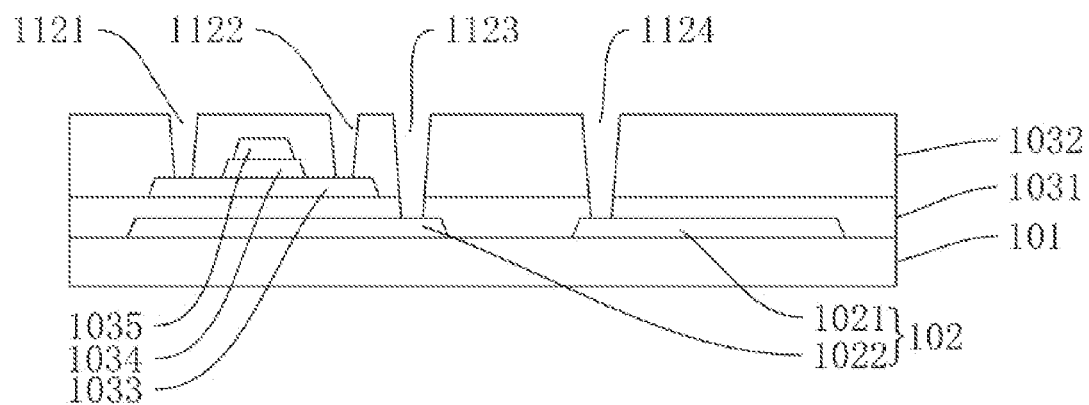
FIG. 4 is another schematic structural diagram of the manufacturing process of the OLED display panel according to an embodiment of the present invention.
Figure 5:
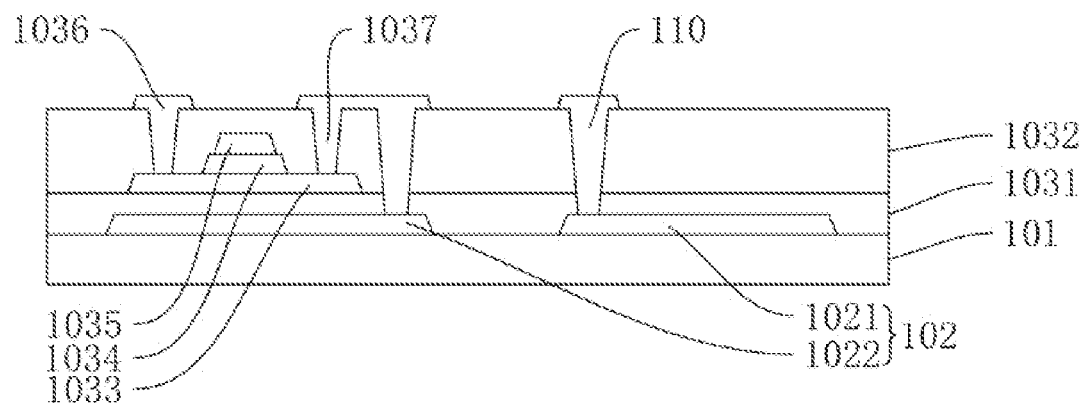
FIG. 5 is yet another schematic structural diagram of the manufacturing process of the OLED display panel according to an embodiment of the present invention.
Figure 6:
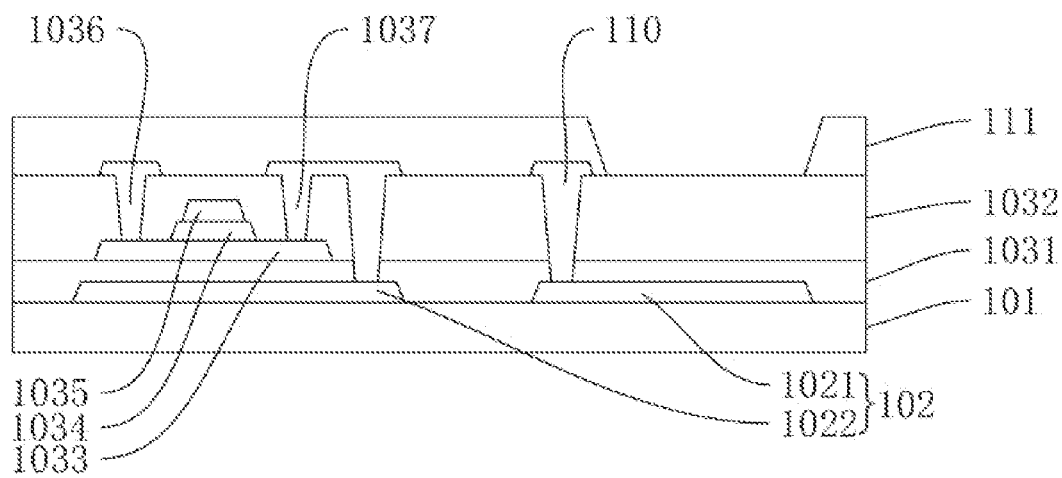
FIG. 6 is still another schematic structural diagram of the manufacturing process of the OLED display panel according to an embodiment of the present invention.
Figure 7:
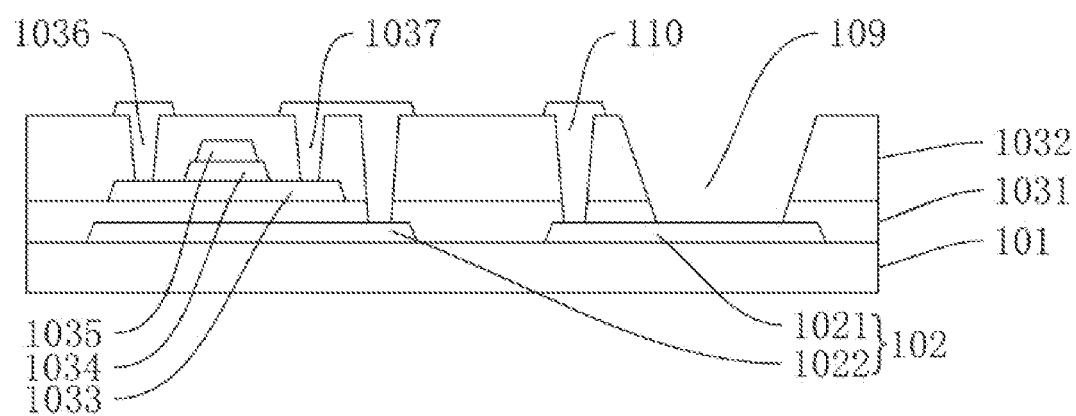
FIG. 7 is still another schematic structural diagram of the manufacturing process of the OLED display panel according to an embodiment of the present invention.

Moreover, an embodiment of the present invention also provides a manufacturing method of an OLED display panel. Referring to FIG. 1, FIG. 2, FIG. 3, FIG. 4, FIG. 5, FIG. 6 and FIG. 7, the OLED display panel comprises a display area 10 and a bonding area 20 defined at least at one side of the display area 10.

The manufacturing method of the OLED display panel comprises:

step S10, preparing a first metal layer 102 on a substrate 101, and the first metal layer 102 comprises a light-shielding metal 1022 disposed corresponding to the display area 10 and a bonding metal 1021 disposed corresponding to the bonding area 20.

A substrate 101 is provided, and a patterned first metal layer 102 is prepared on the substrate 101. The first metal layer 102 comprises a light-shielding metal 1022 disposed corresponding to the display area 10 and a bonding metal 1021 disposed corresponding to the bonding area. The substrate 101 comprises a glass substrate. A material of the first metal layer 102 comprises a molybdenum titanium alloy or an aluminum titanium alloy, and is not limited to a single-layer or laminated alloy structure of molybdenum and titanium, or a single-layer or laminated alloy structure of aluminum and titanium. In addition, the material of the first metal layer 102 may also comprise other metal materials or alloy materials with strong acid resistance and strong reliability.

Step S20, preparing a thin film transistor device layer 103 on the first metal layer 102, and the thin film transistor device layer 103 comprises a thin film transistor and a spacer layer correspondingly located above the light-shielding metal 1022, the spacer layer is formed with an opening 109 in the bonding area 20 to expose a portion of an upper surface of the bonding metal 1021.

Specifically, the step S20 comprises:

step S201, preparing a buffer layer 1031 on the substrate 101; preparing an active layer 1033 on the buffer layer 1031, and the active layer 1033 is located above the light-shielding metal 1022; sequentially preparing a gate insulating layer 1034 and a gate electrode 1035 on the active layer 1033; and preparing an interlayer dielectric layer 1032 on the active layer 1033 and the gate electrode 1035.

Further, a first via hole 1121 and a second via hole 1122 penetrating a portion of the interlayer dielectric layer 1032 are prepared corresponding to the display area 10, so as to respectively expose upper surfaces on both sides of the active layer 1033. A third via hole 1123 and a fourth via hole 1124 penetrating the interlayer dielectric layer 1032 and a portion of the buffer layer 101 are respectively prepared corresponding to the display area 10 and the bonding area 20, so as to respectively expose a portion of an upper surface of the light-shielding metal 1022 and a portion of the upper surface of the bonding metal 1021.

Step S202, preparing a second metal layer on the interlayer dielectric layer 1032, performing an etching process on the second metal layer to obtain the source electrode 1037 and the drain electrode 1036 disposed corresponding to the display area 10, and disposing a signal trace 110 corresponding to the bonding area 20. The source electrode 1037 and the drain electrode 1036 respectively fill the first via hole 1121 and the second via hole 1122 and respectively connect to one side of the active layer 1033. The source electrode 1037 also fills the third via hole 1123 and connects to the light-shielding metal 1022, and the signal trace 110 fills the fourth via hole 1124 and connects to the bonding metal 1021, such that the bonding metal 1021 is electrically connected to the thin film transistor through the signal trace 110. In the subsequent manufacturing process, the bonding metal 1021 is further electrically bonded to the circuit board, so that the transmission of the display signal can be realized, thereby realizing the display function of the OLED display panel.

Step S203, coating a photoresist material layer 111 on the interlayer dielectric layer 1032 to cover a portion of an upper surface of the interlayer dielectric layer 1032; performing an opening treatment for the interlayer dielectric layer 1032 not covered by the photoresist material layer 111; and removing at least the buffer layer 1031 and the interlayer dielectric layer 1032 above the bonding metal 1021 to form an opening 109, and thus exposing a portion of the upper surface of the bonding metal 1021. In the embodiment of the present invention, the opening treatment is performed after the etching of the second metal layer is completed, thus preventing the bonding metal 1021 from being corroded by the Cu acid etching solution during the etching of the second metal layer, thereby further improving product yield.

Furthermore, an interlayer insulating layer 104, a planarization layer 105, an anode 107, and a pixel defining layer 106 are sequentially disposed on the interlayer dielectric layer 1032, and the interlayer insulating layer 104, the planarization layer 105, the anode 107, and the pixel defining layer 106 are all disposed staggered from the opening 109 to expose a portion of the upper surface of the bonding metal 1021. In the process of preparing the anode 107, since the first metal layer 102 has a high corrosion resistance, the bonding metal 1021 can resist corrosion by the etching solution, and the first metal layer 102 has a better reliability, thus improving the reliability of the bonding metal 1021 during testing or in the environment, and improving the reliability and stability of the OLED display panel.

The anode 107 is also connected to the source electrode 1037 through a via hole penetrating the planarization layer 105 and a portion of the interlayer insulating layer 104. The pixel defining layer 106 defines a pixel opening through a barrier structure to expose the upper surface of the anode 107, and a light-emitting layer 108 is formed inside the pixel opening. The light-emitting layer 108 is correspondingly located on the anode 107, and the light-emitting layer 108 can be prepared by an evaporation process or an ink-jet printing process. The material of pixel defining layer 106 is not limited to non-hydrophobic materials or hydrophobic materials.

The embodiment of the present invention uses the metal material of the same layer as the light-shielding metal to make the bonding metal while preparing the light-shielding metal. Since the light-shielding metal has a better stability and corrosion resistance, it thereby improves the stability and corrosion resistance of the bonding metal, and improves the reliability and yield of the OLED display panels.

In the foregoing embodiments, the descriptions of the embodiments have their respective focuses. For a part that is not described in detail in an embodiment, reference may be made to related descriptions in other embodiments.

The above describes in detail an OLED display panel and its manufacturing method provided by the embodiments of the present invention. Specific examples are used herein to illustrate the principles and implementations of the present invention. The description of the above embodiments is only used to help understanding the technical solutions of the present invention and its core concept. Those skilled in the art should understand that they may still make modifications to the technical solutions described in the foregoing embodiments or make equivalent replacements to some or all technical features thereof, without departing from the scope of the technical solutions of the embodiments of the present invention.

What is claimed is:

1. An OLED display panel, comprising a display area and a bonding area defined at least at one side of the display area; the OLED display panel further comprising:
a substrate;
a first metal layer disposed on the substrate, wherein the first metal layer comprises a light-shielding metal disposed in the display area and a bonding metal disposed in the bonding area, the bonding metal being light-shielding; and
a thin film transistor device layer disposed on the first metal layer, wherein the thin film transistor device layer comprises a thin film transistor and a spacer layer located above the light-shielding metal, and the spacer layer is formed with an opening in the bonding area to expose a portion of an upper surface of the bonding metal;
wherein a material of the first metal layer comprises an aluminum titanium alloy,
the thin film transistor device layer further comprises a second metal layer located above the first metal layer, and the second metal layer comprises a signal trace disposed in the bonding area, and
the signal trace is connected to the bonding metal through a first via hole penetrating a portion of the spacer layer, and the first via hole is spaced apart from the opening.

2. The OLED display panel as claimed in claim 1, wherein the second metal layer further comprises a source electrode and a drain electrode disposed in the display area.

3. The OLED display panel as claimed in claim 2, wherein the source electrode is connected to the light-shielding metal through a second via hole penetrating a portion of the spacer layer, and the bonding metal is electrically connected to the thin film transistor through the signal trace.

4. The OLED display panel as claimed in claim 2, wherein the OLED display panel further comprises an interlayer insulating layer, a planarization layer, an anode, and a pixel defining layer sequentially disposed on the thin film transistor device layer, and the interlayer insulating layer, the planarization layer, the anode, and the pixel defining layer are all disposed staggered from the opening to expose the portion of the upper surface of the bonding metal.

5. The OLED display panel as claimed in claim 4, wherein the anode is connected to the source electrode through a third via hole penetrating the planarization layer and a portion of the interlayer insulating layer.

6. The OLED display panel as claimed in claim 4, wherein the pixel defining layer has a pixel opening that exposes an upper surface of the anode, and the OLED display panel further comprises a light-emitting layer disposed inside the pixel opening and covering the upper surface of the anode.

7. An OLED display panel, comprising a display area and a bonding area defined at least at one side of the display area; the OLED display panel further comprising:
a substrate;
a first metal layer disposed on the substrate, wherein the first metal layer comprises a light-shielding metal disposed in the display area and a bonding metal disposed in the bonding area, the bonding metal being light-shielding; and
a thin film transistor device layer disposed on the first metal layer, wherein the thin film transistor device layer comprises a thin film transistor and a spacer layer located above the light-shielding metal, and the spacer layer is formed with an opening in the bonding area to expose a portion of an upper surface of the bonding metal,
wherein the thin film transistor device layer further comprises a second metal layer located above the first metal layer, and the second metal layer comprises a signal trace disposed in the bonding area, and
the signal trace is connected to the bonding metal through a first via hole penetrating a portion of the spacer layer, and the first via hole is spaced apart from the opening.

8. The OLED display panel as claimed in claim 7, wherein the second metal layer further comprises a source electrode and a drain electrode disposed in the display area.

9. The OLED display panel as claimed in claim 8, wherein the source electrode is connected to the light-shielding metal through a second via hole penetrating a portion of the spacer layer, and the bonding metal is electrically connected to the thin film transistor through the signal trace.

10. The OLED display panel as claimed in claim 8, wherein the OLED display panel further comprises an interlayer insulating layer, a planarization layer, an anode, and a pixel defining layer sequentially disposed on the thin film transistor device layer, and the interlayer insulating layer, the planarization layer, the anode, and the pixel defining layer are all disposed staggered from the opening to expose the portion of the upper surface of the bonding metal.

11. The OLED display panel as claimed in claim 10, wherein the anode is connected to the source electrode through a third via hole penetrating the planarization layer and a portion of the interlayer insulating layer.

12. The OLED display panel as claimed in claim 10, wherein the pixel defining layer has a pixel opening that exposes an upper surface of the anode, and the OLED display panel further comprises a light-emitting layer disposed inside the pixel opening and covering the upper surface of the anode.

13. A manufacturing method of an OLED display panel, the OLED display panel comprising a display area and a bonding area defined at least at one side of the display area, the method comprising:
   preparing a first metal layer on a substrate, wherein the first metal layer comprises a light-shielding metal disposed in the display area and a bonding metal disposed in the bonding area, the bonding metal being light-shielding; and
   preparing a thin film transistor device layer on the first metal layer, wherein the thin film transistor device layer comprises a thin film transistor and a spacer layer located above the light-shielding metal, and the spacer layer is formed with an opening in the bonding area to expose a portion of an upper surface of the bonding metal,
   wherein the preparing of the thin film transistor device layer on the first metal layer comprises:
   sequentially preparing a buffer layer, an active layer, a gate insulating layer, a gate electrode, and an interlayer dielectric layer on the first metal layer;
   preparing a second metal layer on the interlayer dielectric layer, wherein the second metal layer comprises a signal trace disposed in the bonding area; and
   removing at least the buffer layer and the interlayer dielectric layer above the bonding metal to form the opening to expose the portion of the upper surface of the bonding metal,
   wherein the signal trace is connected to the bonding metal through a first via hole penetrating a portion of the spacer layer, and the first via hole is spaced apart from the opening, and
   a material of the first metal layer comprises an aluminum titanium alloy.

14. The manufacturing method of the OLED display panel as claimed in claim 13, wherein the second metal layer comprises a source electrode and a drain electrode disposed in the display area.

15. The manufacturing method of the OLED display panel as claimed in claim 14, wherein the sequentially preparing of the buffer layer, the active layer, the gate insulating layer, the gate electrode, and the interlayer dielectric layer on the first metal layer comprises: preparing a second via hole and a third via hole penetrating a portion of the interlayer dielectric layer in the display area, so as to expose upper surfaces on both sides of the active layer respectively, and a fourth via hole and the first via hole penetrating the interlayer dielectric layer and a portion of the buffer layer are prepared in the display area and the bonding area respectively, so as to expose a portion of an upper surface of the light-shielding metal and the portion of the upper surface of the bonding metal respectively.

16. The manufacturing method of the OLED display panel as claimed in claim 15, wherein the preparing of the second metal layer on the interlayer dielectric layer comprises: filling one of the second via hole or the third via hole and connecting to one side of the active layer by the source electrode, filling an other of the second via hole or the third via hole and connecting to an other side of the active layer by the drain electrode, filling the fourth via hole and connecting to the light-shielding metal by the source electrode, and filling the fourth first via hole and connecting to the bonding metal by the signal trace.

17. The manufacturing method of the OLED display panel as claimed in claim 14, wherein the removing of at least the buffer layer and the interlayer dielectric layer above the bonding metal to form the opening comprises: preparing a photoresist material layer to cover a portion of an upper surface of the interlayer dielectric layer, and removing a portion of the interlayer dielectric layer whose upper surface is not covered by the photoresist material layer and a portion of the buffer layer opposite to the portion of the upper surface of the interlayer dielectric layer to form the opening.

18. The manufacturing method of the OLED display panel as claimed in claim 14, wherein the removing of at least the buffer layer and the interlayer dielectric layer above the bonding metal to form the opening further comprises sequentially preparing an interlayer insulating layer, a planarization layer, an anode, and a pixel defining layer on the thin film transistor device layer, wherein the interlayer insulating layer, the planarization layer, the anode, and the pixel defining layer are all disposed staggered from the opening to expose the portion of the upper surface of the bonding metal.

19. The manufacturing method of the OLED display panel as claimed in claim 18, wherein the anode is connected to the source electrode through a fifth via hole penetrating the planarization layer and a portion of the interlayer insulating layer.

* * * * *